United States Patent [19]

Balachandran et al.

[11] Patent Number: 5,086,034
[45] Date of Patent: Feb. 4, 1992

[54] CALCINATION AND SOLID STATE REACTION OF CERAMIC-FORMING COMPONENTS TO PROVIDE SINGLE-PHASE SUPERCONDUCTING MATERIALS HAVING FINE PARTICLE SIZE

[75] Inventors: Uthamalingam Balachandran, Hinsdale; Roger B. Poeppel, Glen Ellyn; James E. Emerson, Plainfield; Stanley A. Johnson, Countryside, all of Ill.

[73] Assignee: The United States of America as represented by the United States Department of Energy, Washington, D.C.

[21] Appl. No.: 589,562

[22] Filed: Sep. 28, 1990

[51] Int. Cl.$^5$ .................. H01L 39/12; C01F 17/00
[52] U.S. Cl. ........................ 505/1; 505/725; 505/742; 505/737; 505/780; 252/518; 252/521; 423/593; 501/123
[58] Field of Search .............. 505/1, 725, 742, 737, 505/780; 252/518, 521; 423/593; 501/123

[56] References Cited

U.S. PATENT DOCUMENTS 4,943,557 6/1990 Ling .......................... 505/1

OTHER PUBLICATIONS

UNO et al., "Synthesis of Superconductive Oxides by Vacuum Calcination Method," Jap. Jrnl. App. Phys. vol. 27, No. 6, Jun. 1988 pp. L1003–L1006.
Iguchi et al., "Structural and Superconducting Properties of YBA$_2$Cu$_3$O$_{7-0}$ Formed Under Oxygen Pressure Control," Jap. Jrnl. App. Phys. vol. 27, No. 6 Jun. 1988, pp. L992–L995.
Goretta et al., "Calcination of YBa$_2$Cu$_3$O$_{7-x}$ Powder", Materials Letters, vol. 7, No. 5,6, Nov. 1988.
McCallum et al., "Problems in the Production of YBa$_2$Cu$_3$O$_x$, Superconducting Wire", Adv. Ceramic Materials, vol. 2, No. 3B, 1987.
Sherwood et al., "Superconducting Properties of YBa$_2$Cu$_3$O$_{7-x}$ Doped with Various Metals and Oxides", Mat. Res. Soc. Symp., Proc. vol. 99, Dec. 1987.
Balachandran et al., "Synthesis of Phase-Pure Orthorhombic YBa$_2$Cu$_3$O$_x$ Under Low Oxygen Pressure", Materials Letters, vol. 8, No. 11,12, Nov. 1989.
Balachandraw et al., "Synthesis of 80 K Superconducting YBa$_2$Cu$_4$O$_8$ via a Novel Route".

Primary Examiner—Paul Lieberman
Assistant Examiner—Bradley A. Swope
Attorney, Agent, or Firm—James W. Weinberger; Thomas G. Anderson; William R. Moser

[57] ABSTRACT

An improved method for the preparation of single phase, fine grained ceramic materials from precursor powder mixtures where at least one of the components of the mixture is an alkali earth carbonate. The process consists of heating the precursor powders in a partial vacuum under flowing oxygen and under conditions where the partial pressure of CO$_2$ evolved during the calcination is kept to a very low level relative to the oxygen. The process has been found particularly suitable for the preparation of high temperature copper oxide superconducting materials such as YBa$_2$Cu$_3$O$_x$ "123" and YBa$_2$Cu$_4$O$_8$ "124".

8 Claims, 1 Drawing Sheet

CALCINATION AND SOLID STATE REACTION OF CERAMIC-FORMING COMPONENTS TO PROVIDE SINGLE-PHASE SUPERCONDUCTING MATERIALS HAVING FINE PARTICLE SIZE

CONTRACTUAL ORIGIN OF THE INVENTION

This invention was made with Government support under Contract No. W-31-109-ENG-38 awarded by the United States Department of Energy. The Government has certain rights in the invention.

BACKGROUND OF THE INVENTION

This invention relates to an improved method of preparing ceramic materials to provide a ceramic product having a single phase and a fine particle size. More specifically this invention relates to a method of preparing single phase, fine particle size ceramic materials from mixtures of precursor powders, when at least one of the components of the mixture is a carbonate. Still more specifically, this invention is an improved method of preparing single phase, fine grain copper oxide superconductors from precursor powder mixtures where at least one component of the mixture is an alkali earth carbonate.

High-temperature ceramic superconductors are normally prepared by solid-state reaction of oxides, carbonates, or nitrates. For $YBa_2Cu_3O_x$ ("123"), $Y_2O_3$, CuO, and $BaCO_3$ are mixed in appropriate proportions and wet milled for approximately 12 hours to prepare a slurry. The wet milled slurry is dried in air and the dried precursor powder calcined at 890-980° C. for 20 to 100 hours. Intermittent grinding is necessary to obtain relatively phase-pure and homogeneous "123" powders. The high temperatures used in the conventional method can induce formation of liquids and non-superconducting phases such as $Y_2BaCuO_5$ and $BaCuO_2$. Furthermore, the $CO_2$ released during decomposition of $BaCO_3$, can react with the other components to form $BaCO_3$, $Y_2O_3$, CuO and $Y_2Cu_2O_5$, depending on the temperature. The presence of these non-superconducting phases, especially at grain boundaries, lowers critical current density ($J_c$). In addition to producing undesirable phases, the conventional processes are time consuming and produce coarse particles. Partial vacuums have been utilized to calcine powders and to sinter polycrystalline bodies, however, in all cases multiphase materials resulted.

A method has been developed for preparing "123" superconductors from precursor powder mixtures which produces single phase, fine grain materials having good bulk superconducting properties. It has been found that by calcining the precursor mixtures in reduced total pressure under flowing oxygen and carefully controlling the partial pressure of $CO_2$, it is possible to reduce the calcination temperature and eliminate the several grinding and heating steps usually associated with the preparation of the ceramic superconductors. The low pressure enhances the reaction rates thereby substantially reducing the amount of time required for preparation of the superconductor material. The process is suitable for the preparation of copper and other metal oxide superconductor materials and for a wide variety of other ceramic materials which can be prepared by solid state reaction by calcining precursor powder mixtures in which at least one of the components of the mixture is an alkali earth carbonate.

BRIEF DESCRIPTION OF THE INVENTION

The invention is an improved method of preparing single phase ceramic materials by the calcination of a stoichiometric precursor powder mixture comprising: preparing a stoichiometric precursor mixture containing at least one alkali earth carbonate and calcining the mixture by the following steps: (a) heating the mixture in a furnace to a first temperature, said first temperature being a temperature at about which $CO_2$ will begin to evolve from the precursor mixture; (b) establishing a partial vacuum in the furnace; (c) providing flowing oxygen at reduced pressure to the furnace; (d) heating the mixture to a second temperature, the second temperature being the temperature at which $CO_2$ evolution and reaction of the mixture will go to completion, (e) simultaneously with step (d), controlling the rate of evolution of $CO_2$ from the mixture as the mixture is heated so that the partial pressure of $CO_2$ in the furnace is no greater than about 2.66 pa (0.02 mm Hg); and (f) maintaining the mixture at the second temperature for a period of time sufficient for $CO_2$ evolution to cease and for reaction to go to completion, thereby forming the single phase ceramic material.

As used herein, the phrases "superconductor" and "superconducting material" refer to materials which when cooled to appropriate temperatures will exhibit superconducting properties. The phrases "calcination" or "calcining" as used herein refer to the evolution of $CO_2$ and the reaction of the precursor materials to form the ceramic material.

It is therefore one object of the invention to provide an improved method of preparing ceramic materials.

It is another object of the invention to provide an improved method of preparing ceramic materials from precursor powders containing at least one carbonate.

It is still another object of the invention to provide an improved method of preparing ceramic materials of a desired stoichiometry.

It is a further object of the invention to provide an improved method of preparing ceramic materials which reduces the time and steps required to prepare high quality materials from precursor powders containing at least one carbonate.

It is yet another object of the invention to provide an improved method of preparing metal oxide superconductors from precursor powders.

Finally, it is the object of the invention to provide an improved method of preparing single phase copper oxide superconductors having a fine grain size from precursor powders containing at least one alkali earth carbonate.

DESCRIPTION OF THE PREFERRED EMBODIMENT

Figure 1:
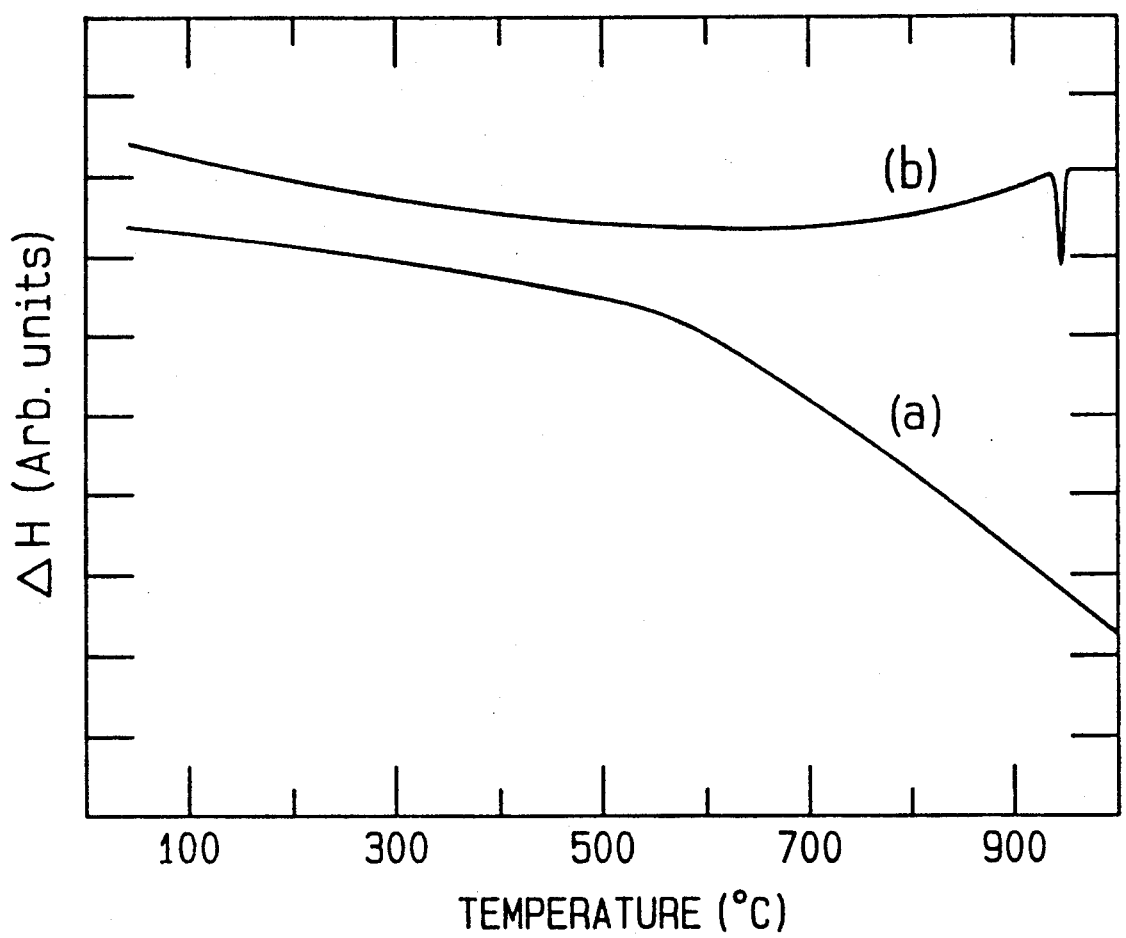
FIG. 1 is a differential thermal analysis comparing "123" powder prepared by the method of the invention with "123" powder prepared under ambient pressure.

These and other objects of the invention for preparing $YBa_2Cu_3O_x$ superconductor, where x is between 6 and 7, may be met by preparing a stoichiometric mixture of powders of $Y_2O_3$, $BaCO_3$, and CuO as a precursor mixture, calcining the mixture by heating the mixture under an atmosphere of flowing oxygen at a pressure of about 266 Pa (2 mm Hg) to about 600° C. wherein $CO_2$ begins to evolve, controlling the heating rate of the mixture to about 20° C. per hour to maintain the partial pressure of $CO_2$ in the atmosphere to no more than about 2.66 Pa (0.02 mm Hg), heating the mixture at the controlled rate to about 800° C., maintaining this temperature for about 4 hours until evolution of $CO_2$ has ceased and reaction of the precursor mixture is complete forming the single phase compound, cooling the compound to about 600° C., increasing the oxygen pressure to about $1 \times 10^5$ Pa (760 mm Hg), and reducing the temperature to about 450° C. and maintaining this for about 3 hours to oxygenate the compound, thereby forming single phase, fine particle size $YBa_2Cu_3O_x$ where x=about 6.95.

As stated above, the method of the invention is suitable for the preparation of a wide variety of bulk ceramic materials, which can be prepared by solid state reaction by calcining precursor powder mixtures in which at least one of the components of the mixture is an alkali earth carbonate such as Ba, Sr, Ca, and Mg. These mixtures on calcination evolve quantities of $CO_2$ which if permitted to become too concentrated in the atmosphere over the precursor powders during calcination can cause in the formation of undesirable phases. In addition to "123", other copper oxide superconducting materials which have been prepared by this method include $YBa_2Cu_4O_8$, (124), $Bi_2Sr_2CaCu_2O_x$ (2212), and $Bi_{1.6}Pb_{0.4}Sr_2Ca_2Cu_3O_x$ (2223). Other ceramic materials which may be prepared by this method include, but are not limited to $BaTiO_3$, and $SrTiO_3$.

The calcining conditions of the precursor powders are most important to the successful preparation of the ceramic materials. Calcination is accomplished by heating the precursor powders under a reduced pressure of flowing oxygen which pressure may vary from about 213 to $2 \times 10^4$ Pa (1.6 to 150 mm Hg). Preferably the oxygen partial pressure is from about 266 to 1330 Pa, most preferable 266 to 532 Pa. An oxygen pressure which is too high will slow the evolution of $CO_2$, increasing the time required for calcination to go to completion while a pressure less than about 213 Pa may result in undesirable decomposition of the precursor powders and the formation of non-superconducting phases. Preferably the oxygen is flowing in order to carry off the evolved $CO_2$ and any other gaseous decomposition products which may form. An oxygen flow rate of about 2.3 liters/minutes was found satisfactory for the experiments described below. The degree of vacuum need only be sufficient to permit the desired oxygen pressure. It is important to control the partial pressure of the $CO_2$ evolved from the precursor powder during calcination so that it is never greater than about 2.66 Pa or about 1.0% of the preferred 266 pa pressure of oxygen in the furnace. This is accomplished by controlling the oxygen flow rate and/or the rate at which the precursor mixture is heated through the temperature range during which $CO_2$ is evolved. Thus the mixture can be rapidly heated to the temperature at which $CO_2$ evolution begins. For example, the evolution of $CO_2$ from the precursor mixture for preparing "123" superconductor, begins about 625° C. Therefore when the temperature of the precursor mixture reaches about 625-650° C., and while maintaining the oxygen flow rate, the heating rate is controlled in order to control the evolution of $CO_2$ so that the partial pressure of $CO_2$ in the atmosphere over the calcining precursor mixture is never greater than about 2.66 Pa. For the "123" precursor powder, a heating rate of about 20° C. per hour, starting from about 625° C. was found satisfactory. This heating rate is maintained until the precursor mixture reaches the temperature at which evolution of $CO_2$ will go to completion and at which formation of the ceramic material is completed. The temperature at which $CO_2$ evolution begins and the rate of heating during evolution of the $CO_2$ will depend upon the specific ceramic material under going formation.

Preferably the "123" precursor powders are heated to about 785° to 815° C., preferably 800° C., and held at this temperature for about 4 hours or until evolution of $CO_2$ ceases and formation of the ceramic is complete. Temperatures above about 815° C. will result in an undesirable coarsening of the particles. Below 785° C., the time required for the reaction to go to completion will be inordinately long and the reaction may not go quite to completion. The temperature and time required at that temperature for formation of the ceramic material to go to completion will depend upon the specific ceramic material being formed.

When preparing superconducting materials, such as "123" or "124" , additional steps, depending on the material, are necessary to form the desired superconducting phase. For example, after completion of "123" formation at 800° C., in order to prevent decomposition of the ceramic, the material is allowed to cool, in reduced oxygen pressure, to 650° to 550° C., preferably about 600° C., at a rate from 25° to 75° C. per hour, although the rate of cooling is not critical. At this temperature the oxygen pressure is increased to about ambient, i.e. to a pressure in the range from $4.8 \times 10^4$ to $2.0 \times 10^5$ Pa, preferably about $1.0 \times 10^5$ Pa and cooling is continued until the temperature reaches about 425° to 500°, preferably 450° C. This temperature is maintained for a period of time sufficient for the ceramic to fully oxygenate and for orthorhombic superconducting phase formation. Generally a period of about 3 hours was found sufficient for completion of phase formation.

$YBa_2Cu_4O_8$ (124), is prepared in the same manner as described for "123" by calcining the powdered mixture in flowing oxygen at a pressure of about $2.66 \times 10^2$ Pa (2.0 mm Hg) and a heating rate of about 20° C./hour. However, the mixture is held at 750° C. for about 4 hours before being further heated at the rate of 20° C./hour to 800° C. where it is held for about 1 hour to complete $CO_2$ evolution and to complete formation of the ceramic material. The material is then cooled to about 750° C. and ambient pressure oxygen is provided and held for about 10 to 20 hours to complete synthesis of the "124" phase. It should be noted that "124" was the main phase present in the "as-calcined" powder with "123" as a minor phase. Further annealing the calcined powder at 800° C. for 24 hours at one atmosphere oxygen pressure improved phase purity.

The following Examples are given to illustrate the invention and are not to be taken as limiting the scope of the invention which is defined by the appended claims.

EXAMPLE I 121.78 grams of powdered $Y_2O_3$, 422.92 grams of powdered $BaCO_3$, and 255.32 grams of powdered CuO were mixed together and wet milled for 15 hours in methanol in polyethylene jars containing $ZrO_2$ grinding media. The resultant slurry was pan dried and screened through a 30 mesh sieve. The screened powder was placed in dense alumina pans and inserted into a six foot long tube furnace (Lindberg) having a 10 inch diameter bore A vacuum was established in the furnace of about 2.66 Pa (0.02 mm Hg), and oxygen was introduced into the furnace and adjusted to about 266 Pa (2 mm Hg) at a flow rate of about 2.3 liters/minute. The furnace temperature was increased at a rate of about 100° C./hour to about 625° C. when $CO_2$ evolution began. At 625° C. the heating rate was reduced to about 20° C./hour to maintain the $CO_2$ level to no greater than 2.66 Pa (0.02 mm Hg). The $CO_2$ level in the off-gas was monitored with a Bomem Michelson 100 Fourier transform infrared (FTIR) spectrophotometer with 4 $cm^{-1}$ resolution. Heating was continued to 800° C. The temperature and pressure were held at 800° C. for about four hours until $CO_2$ evolution ceased and formation of the ceramic was complete. The material was then cooled to about 600° C. and the vacuum was discontinued and the oxygen pressure increased to $1 \times 10^5$ Pa (760 mm Hg). Cooling was continued to 450° C. and that temperature was held for about 3 hours until oxygenation of the material was complete. After cooling to ambient temperature the material was tested. The powder was shown by X-ray diffraction to be phase pure $YBa_2Cu_3O_{6.95}$. Analysis of the orthorombic-peak split and comparison against published data revealed that no tetragonal phase was present in the powder. The particle size of the powder resulting from this synthesis was 1 to 4 μm. This relative small particle size is believed due to the low processing temperature. The resultant powder was cold-pressed into pellets that were capable of levitating magnets. These pellets were then sintered in $O_2$ to make dense superconductors. For sintering from 915° to 980° C., pellet densities ranged from 90 to 96% of theoretical and similar superconducting properties were achieved. The critical current density ($J_c$) measured in zero applied magnetic field at 77 K with a criterion of 1 μV/cm, was about $1.0 \times 10^3$ A/$cm^2$.

FIG. 1 is a differential thermal analysis made which compares the phase purity of the YBCO powder (a) of Example 1 with the same powder calcined at ambient pressure (b). For the powder calcined at low pressure, the only event observed is a change in slope caused by conversion of the powder from orthorhombic to tetragonal upon heating. The ambient pressure processed powder exhibits an endotherm at about 920° C., caused by melting of a $CuO$-$BaCuO_2$ eutectic present as an impurity in the powder.

EXAMPLE II

In a manner similar to that described in Example I a precursor powder mixture for "123" was prepared and placed into the tube furnace. A vacuum was established in the furnace of about 2.66 Pa (0.02 mm Hg) and oxygen was introduced into the furnace and adjusted to a pressure of about 266 Pa (2 mm Hg) at a flow rate of about 2.3 liters/minute. The furnace temperature was increased at a rate of about 100° C./hour up to 800° C. The partial pressure of $CO_2$ in the off-gas was monitored as before and was found to be about 4.65 Pa. The temperature and pressure were held at 800° C., for about four hours until $CO_2$ ceased and the reaction was complete. The material was cooled to about 600° C. and the vacuum was discontinued and the oxygen pressure increased to $1 \times 10^5$ Pa. Cooling was continued to 450° C. and that temperature held until oxygenation of the material was complete. An x-ray diffraction study of the material showed that while "123" was the major phase, the material also contained 3 minor phases consisting of $Y_2Cu_2O_5$, $BaCuO_2$ and $Y_2BaCuO_5$.

EXAMPLE III

In a manner similar to that described in Example I, 17.23 gm of powdered $Y_2O_3$, 59.83 gm of powdered $BaCO_3$, and 48.17 gm $CuO$ were mixed for the preparation of $YBa_2Cu_4O_8$ or "124". The dried and screened powder was calcined in flowing oxygen under a total oxygen pressure of $2.66 \times 10^2$ Pa (2.0 mm Hg) at a rate of 120° C./hour to 625° C., then at 20° C. per hour to 750° C. The material was held at 750° C. for 4 hours before heating proceeded at a rate of 20° C./hour to 800° C. where it was held for 1 hour to complete $CO_2$ evolution and to complete formation of the ceramic material. During cooling from 800° C., the vacuum was discontinued and ambient pressure oxygen was passed into the furnace at around 750° C. which was held for about 20 hours. The phase purity was improved by further annealing in ambient pressure oxygen at 800° C. for about 24 hours. The observed X-ray diffraction pattern of the powder annealed at 800° C. showed that the powder was essentially pure "124" with a particle size of 1 to 5 μm. Further tests showed the transition temperature, $T_c$ to be 80 K.

EXAMPLE IV

In a manner similar to that described above, 163.09 gm of powdered $Bi_2O_3$, 103.34 gm powdered $SrCO_3$, 35.03 gm powdered $CaCO_3$, and 55.69 gm powdered $CuO$ were mixed together to prepare $Bi_2Sr_2CaCu_2O_x$ (2212). The mixture was wet milled, dried, and screened to form the powder precursor. The mixture was calcined in a tube furnace under a vacuum in about 665 Pa (5 mm Hg) of oxygen flowing at a rate of about 1.5 liters/minute. The mixture was heated to about 550° C. at a heating rate of about 100° C./hour. At 550° C., when $CO_2$ evolution began, the heating rate was adjusted to about 20° C./hour and this heating rate was maintained to 760° C. This temperature was held for about 10 hours until $CO_2$ evolution ceased and the 2212 material formed. Although the material was not found to be as phase pure as the 123 and 124 material, it was found to have a $T_c$ of 85 K and samples prepared from this powder had a $J_c$ of about 175 A/$cm_2$.

EXAMPLE V

In a manner similar to that described for Example IV, 111.83 gm of $Bi_2O_3$, 88.58 gm $SrCO_3$, 60.05 gm $CaCO_3$, 71.60 gm $CuO$, and 26.78 gm $PbO$ were mixed to prepare a precursor powder mixture for $Bi_{1.6}PB_{0.4}Sr_2Ca_2Cu_3O_x$ (2223). The mixture was heated using the same schedule set forth in Example IV. Upon testing the material was found to have of $T_c$ of 110 K and a $J_c$ of about 200 A/$cm^2$.

As has been shown by the preceding discussion and Examples, the invention provides an improved method for preparing ceramic materials and more specifically, for preparing high-temperature ceramic superconductors by the solid state reaction of precursor powders to provide a fine grain single phase product.

While there has been disclosed what is considered to be the preferred embodiment of the invention, it is understood that various changes in the details may be made without departing from the spirit, or sacrificing any of the advantages of the present invention.

The embodiment of the invention is which an exclusive property or privilege is claimed is defined as follows:

1. An improved method of preparing copper oxide superconducting materials having one of the following formulas, $YBa_2Cu_3O_x$, $YBa_2Cu_4O_8$, $Bi_2Sr_2CaCu_2O_x$ and $Bi_{1.6}Pb_{0.4}Sr_2Ca_2Cu_3O_x$, wherein said material is prepared by the calcination and reaction of a precursor powder mixture containing at least one alkali earth carbonate comprising:

preparing a stoichiometric precursor mixture containing at least one alkali earth carbonate, calcining and reacting the mixture by the following steps:

(a) heating the mixture in a furnace to a first temperature, said first temperature being a temperature at about which $CO_2$ will begin to evolve from the precursor mixture, (b) simultaneously with step (a) establishing a partial vacuum in the furnace of from about 213 to $2 \times 10^4$ Pa, (c) simultaneously with steps (a) and (b) providing flowing oxygen at a pressure from about 266 to 1330 Pa to the furnace, (d) heating the mixture to at least 750° C. at which temperature $CO_2$ evolution and reaction of the mixture will go to completion, (e) simultaneously with step (d), controlling the rate of evolution of $CO_2$ from the mixture as the mixture is heated so that the partial pressure of $CO_2$ in the furnace is no greater than about 2.66 Pa, (f) maintaining the mixture at 750° C. for a period of time sufficient for $CO_2$ evolution to cease and for the reaction of the mixture to go to completion forming a ceramic material, (g) cooling the ceramic material to a third temperature, the third temperature being a temperature below which the ceramic will not decompose, and (h) increasing the pressure of the oxygen in the furnace to about ambient and soaking the ceramic in the oxygen for a period of time sufficient for the superconducting material to form, thereby forming the copper oxide superconducting material.

2. The method of claim 1 wherein the rate of evolution of $CO_2$ is controlled by controlling the flow rate of oxygen through the furnace and the heating rate of the precursor mixture in the furnace.

3. The method of claim 1 wherein the alkali earth carbonate is selected from the group consisting of barium, strontium and calcium.

4. An improved method of preparing $YBa_2Cu_3O_x$ superconducting material having a single phase and a fine grain size comprising:

preparing a stoichiometric mixture of $Y_2O_3$, $BaCO_3$ and $CuO$ to form a precursor powder mixture;

calcining and reacting the powder mixture by heating the mixture in a furnace to about 600° C. under a partial pressure of flowing oxygen of about 266 Pa until $CO_2$ evolution begins, heating the mixture to about 800° C. while controlling the rate of $CO_2$ from the mixture so that the partial pressure of $CO_2$ in the furnace is no greater than about 2.66 Pa, maintaining the temperature at about 800° C. for about 4 hours until $CO_2$ evolution and the reaction is completed and a ceramic material has been formed, cooling the material to about 600° C. and increasing the oxygen pressure to $1 \times 10^5$ Pa, cooling the material to about 450° C. and maintaining this temperature for a period of time sufficient for the material to fully oxygenate, thereby forming the $YBa_2Cu_3O_x$ superconductor having a single phase and a fine particle size.

5. The method of claim 4 wherein the flow rate of oxygen is about 2.3 liters/minute and the heating rate of the mixture from about 600° C. to about 800° C. is about 20° C. per hour.

6. An improved method of preparing $YBa_2Cu_4O_8$ superconducting material comprising:

preparing a stoichiometric mixture of $Y_2O_3$, $BaCO_3$ and $CuO$ to form a precursor powder mixture;

calcining and reacting the powder mixture by heating the mixture in a furnace to about 625° C. under a partial pressure of flowing oxygen of about 266 Pa until $CO_2$ evolution begins, heating the mixture to about 750° C. while controlling the rate of $CO_2$ evolution from the mixture so that the partial pressure of $CO_2$ in the furnace is no greater than about 2.66 Pa, maintaining the temperature at about 750° C. for about 4 hours, heating the mixture to about 800° C. while controlling the rate of $CO_2$ evolution from the mixture so that the partial pressure of $CO_2$ in the furnace is no greater that about 2.66 Pa, maintaining this temperature for about 1 hour until $CO_2$ evolution and the reaction is completed and a ceramic material has been formed, cooling the material to about 750° C. while increasing the oxygen pressure to $1 \times 10^5$ Pa, and maintaining this temperature and oxygen pressure for a period of time sufficient for the material to fully oxygenate, thereby forming the $YBa_2Cu_4O_8$ superconducting material.

7. The method of claim 6 wherein the flow rate of oxygen is about 2.3 liters/minute and the heating rate of the mixture from about 600° C. to about 800° C. is about 20° C. per hour.

8. The method of claim 7 including the additional step of heating the $YBa_2Cu_4O_8$ superconducting material to 800° C. under an oxygen pressure of about $1 \times 10^5$ Pa for about 24 hours to improve phase purity.

* * * * *